(12) United States Patent
Hill et al.

(10) Patent No.: US 7,284,168 B2
(45) Date of Patent: Oct. 16, 2007

(54) METHOD AND SYSTEM FOR TESTING RAM REDUNDANT INTEGRATED CIRCUITS

(75) Inventors: J. Michael Hill, Fort Collins, CO (US); Todd Mellinger, Fort Collins, CO (US); David Thomas Newsome, Denver, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 289 days.

(21) Appl. No.: 11/043,377

(22) Filed: Jan. 26, 2005

(65) Prior Publication Data

US 2006/0168488 A1 Jul. 27, 2006

(51) Int. Cl.
*G11C 29/00* (2006.01)

(52) U.S. Cl. ............ 714/718; 365/201; 365/96

(58) Field of Classification Search ............ None
See application file for complete search history.

(56) References Cited

U.S. PATENT DOCUMENTS

| | | | |
|---|---|---|---|
| 5,764,577 A * | 6/1998 | Johnston et al. | 365/200 |
| 5,841,712 A * | 11/1998 | Wendell et al. | 365/200 |
| 5,920,515 A * | 7/1999 | Shaik et al. | 365/200 |
| 6,016,264 A * | 1/2000 | Lin | 365/96 |
| 6,049,977 A * | 4/2000 | Atkins et al. | 29/843 |
| 6,154,851 A * | 11/2000 | Sher et al. | 714/5 |
| 6,252,809 B1 * | 6/2001 | Kim | 365/200 |
| 6,288,436 B1 * | 9/2001 | Narayan et al. | 257/529 |
| 6,367,042 B1 * | 4/2002 | Phan et al. | 714/733 |
| 6,691,252 B2 * | 2/2004 | Hughes et al. | 714/30 |
| 6,928,011 B2 * | 8/2005 | Krishnan et al. | 365/201 |
| 2001/0021134 A1 | 9/2001 | Bohm et al. | |
| 2001/0046168 A1 | 11/2001 | Barth et al. | |
| 2002/0075744 A1 | 6/2002 | McCollum | |
| 2002/0093867 A1 | 7/2002 | Muraoka et al. | |
| 2002/0110033 A1 | 8/2002 | Forbes | |
| 2002/0154553 A1 | 10/2002 | Shubat et al. | |
| 2002/0181302 A1 | 12/2002 | Beer | |
| 2002/0196693 A1 | 12/2002 | Bertin et al. | |
| 2003/0155961 A1 | 8/2003 | Fifield et al. | |
| 2003/0164510 A1 | 9/2003 | Dono | |
| 2003/0205777 A1 | 11/2003 | Ito et al. | |
| 2003/0209734 A1 | 11/2003 | Kothandaraman | |
| 2004/0037128 A1 | 2/2004 | Kaiser et al. | |
| 2004/0114433 A1 | 6/2004 | Forbes | |
| 2004/0119139 A1 | 6/2004 | Hojo et al. | |
| 2004/0129952 A1 | 7/2004 | Griesmer et al. | |
| 2004/0155315 A1 | 8/2004 | Marr et al. | |
| 2004/0165457 A1 | 8/2004 | Park et al. | |

\* cited by examiner

*Primary Examiner*—Phung My Chung

(57) ABSTRACT

System and method of testing a packaged random access memory (RAM) redundant integrated circuit die comprising: identifying a failed element in the redundant RAM of the packaged integrated circuit die; and replacing the failed element with a redundant element in the redundant RAM of the packaged integrated circuit die.

18 Claims, 3 Drawing Sheets

(BACKGROUND)

(BACKGROUND)

(BACKGROUND)

METHOD AND SYSTEM FOR TESTING RAM REDUNDANT INTEGRATED CIRCUITS

BACKGROUND

Random access memory (RAM) includes digital bit storage cells in an array of rows and columns. A RAM redundant integrated circuit is an integrated circuit or chip which includes a redundant RAM which is a RAM that contains redundant rows and/or columns of bit storage cells. The redundant rows or columns are used to replace rows or columns of the RAM that have failed under test. Thus, a chip found to have a failed row or column during test may be repaired by replacing the failed row or column with a good redundant row or column.

An exemplary RAM redundant integrated circuit production process may be described by a flow chart of steps depicted in FIG. 1. Block diagram schematics of FIGS. 2 and 3 exemplify present techniques for testing the RAM redundant integrated circuits. Referring to FIGS. 1-3, RAM redundant integrated circuit dies 10 are fabricated on a silicon wafer 12. Once the fabrication process is complete, the integrated circuit dies 10 of the wafer 12 may be coupled electrically to a tester unit 14 over test signal lines 16, for example. In step A1, each RAM of the dies 10 is tested at the wafer level. In step A2, if the tester unit 14 finds a failed row or column in a RAM, it may output programming data to a file which is read by a separate laser programmer 18 to perform the programming of the RAM.

Currently, RAM redundant integrated circuit dies include programmable fuses which may be blown to connect a redundant row or column of a RAM to replace a failed row or column. In step A2, programming is accomplished at the wafer level by the programmer 18 controlling a laser 20 to blow appropriate fuses of a die 10 with its laser beam 22 to replace each failed row (or column) of each RAM with a redundant row (or column). In step A3, each programmed die 10 may be sectioned from the wafer and disposed in an appropriate package 24. Input/output circuits of the die 10 are connected to corresponding pins 26 of the package 24 to form a RAM integrated circuit part.

Each packaged part 24 undergoes a burn in period in step A4 to screen out parts that may fail early. A typical burn in process may include disposing the part in a high temperature oven 30, the temperature of which being controlled by a temperature controller 32. During the burn in operation, high voltage signals may be applied to the pins 26 of the RAM part 24 by a tester-signal generator 40 via signal lines 34, connector 36 and leads 38. A typical burn in process may take approximately two hours, for example. However, it is understood that burn in times may vary widely depending on such factors as fabrication process, die area, and burn in voltage and temperature, for example. Some types of burn in ovens include electronic hardware for running vectors to test the RAM parts. Parts that fail burn in are usually parts that are found to consume too much current or to have a continuity error, such as a short or open circuit, for example. Such failed parts may not make it to a package test.

After burn in, the packaged parts 24 are retested by the tester 40 in step A5. If the part 24 passes the package test as determined by step A6, the part 24 is put in inventory for later shipment to a customer. Otherwise, if the part fails the test as determined by step A6, the part is scrapped. There is no procedure in the current production process to repair or reprogram the redundant RAM at the package level. Accordingly, if a row or column is determined to have failed at the package level, during burn in or retest, the entire packaged part is scrapped which reduces the overall production yield.

SUMMARY

In accordance with one aspect of the present invention, a method of testing a packaged random access memory (RAM) redundant integrated circuit die comprises: identifying a failed element in the redundant RAM of said packaged integrated circuit die; and replacing said failed element with a redundant element in the redundant RAM of said packaged integrated circuit die.

DETAILED DESCRIPTION

Figure 1:
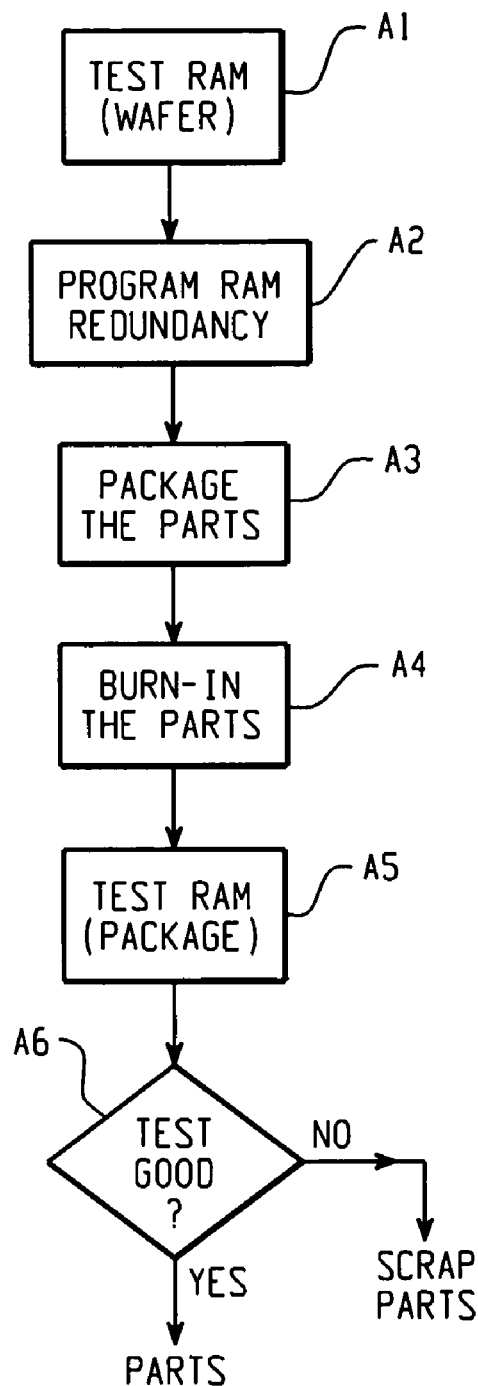
FIG. 1 is a flow chart of steps of an exemplary process for producing RAM redundant integrated circuits.
Figure 4:
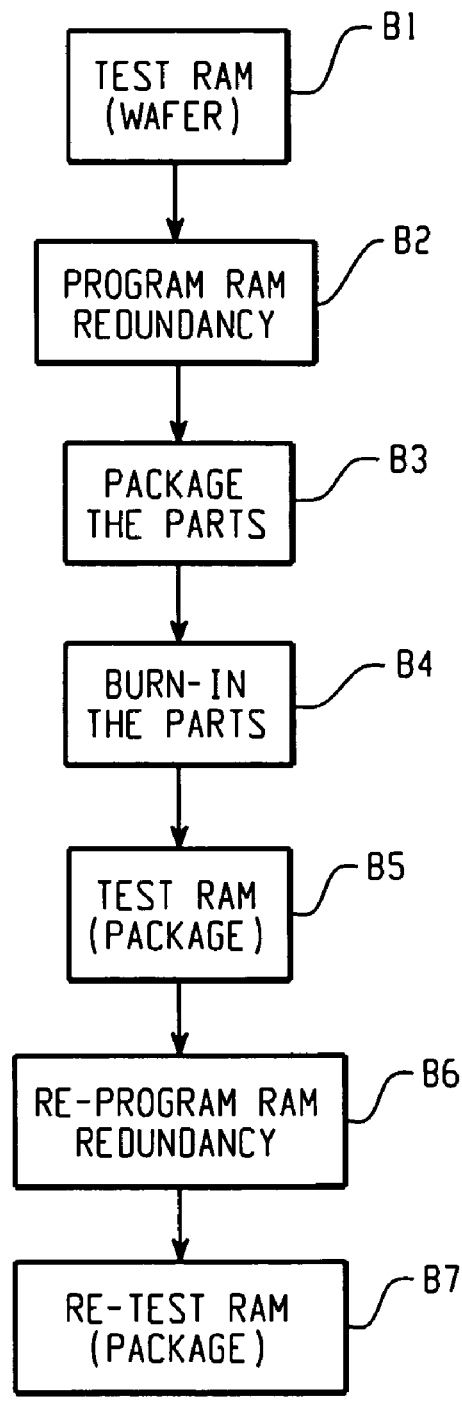
FIG. 4 is a flow chart of steps of an exemplary process for producing RAM redundant integrated circuits in accordance with one aspect of the present invention.
Figure 2:
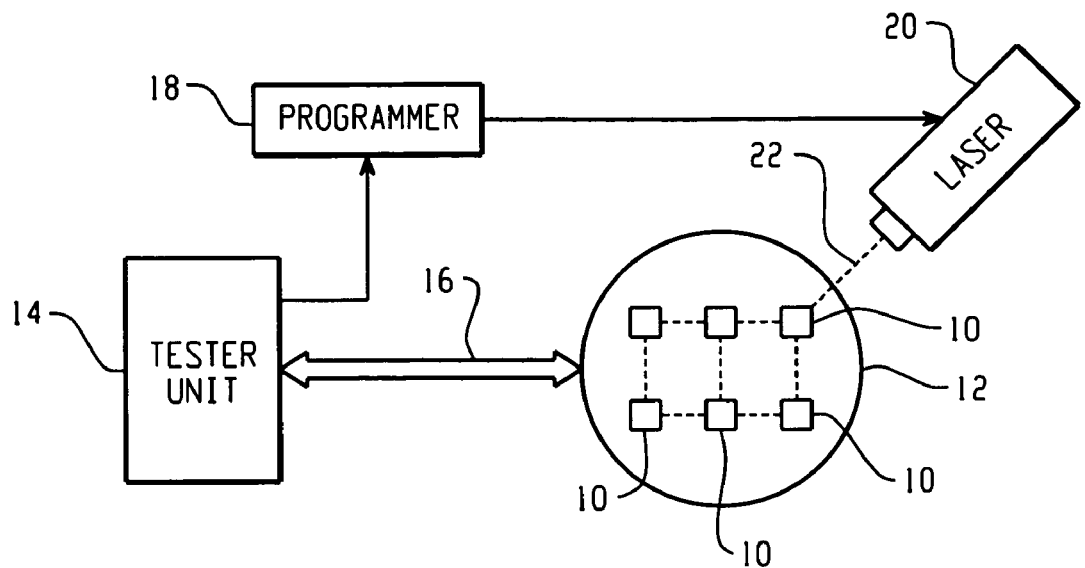
FIGS. 2 and 3 are block diagram schematics of exemplary present systems for testing the RAM redundant integrated circuits in accordance with the steps of the flow chart of FIG. 1.
Figure 3:
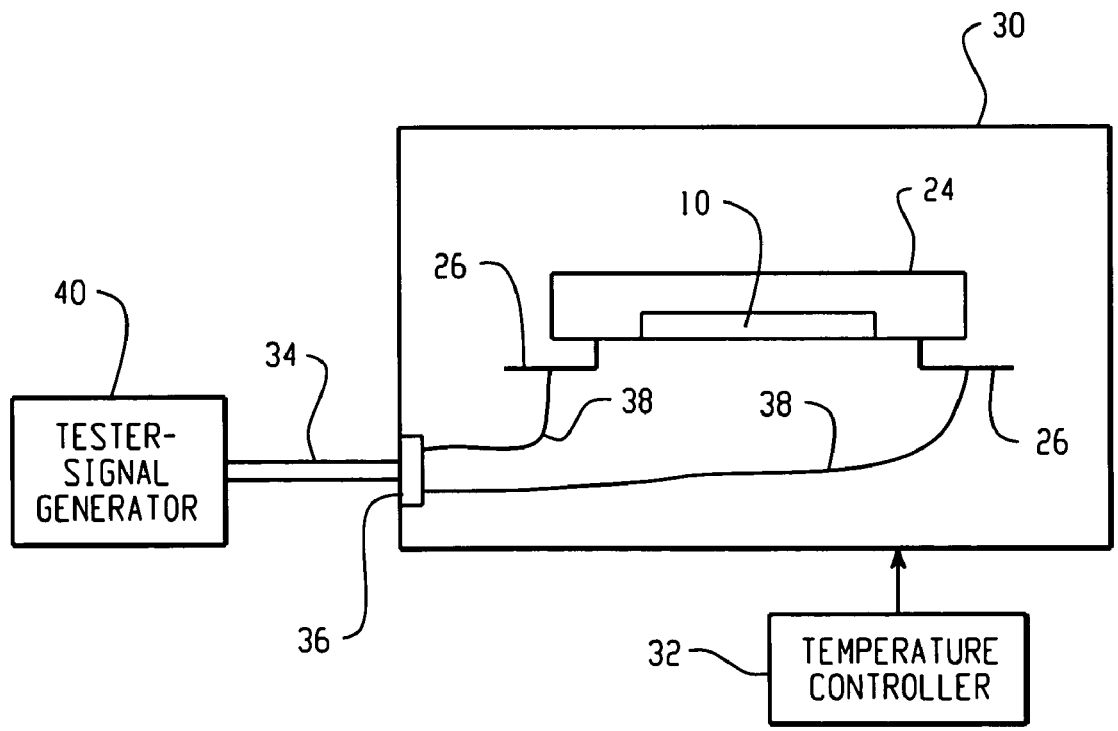
Figure 5:
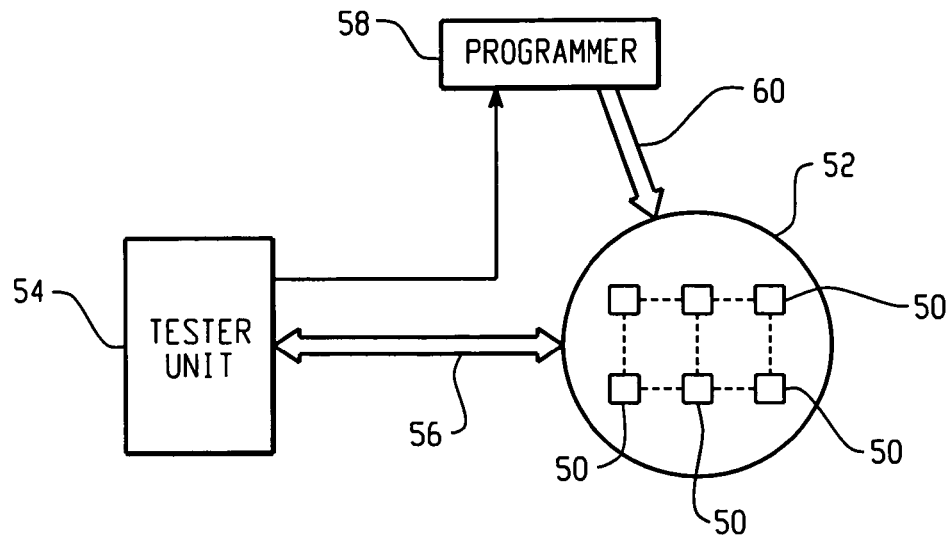
FIGS. 5 and 6 are block diagram schematics of exemplary systems for testing the RAM redundant integrated circuits in accordance with the steps of the flow chart of FIG. 4.
Figure 6:
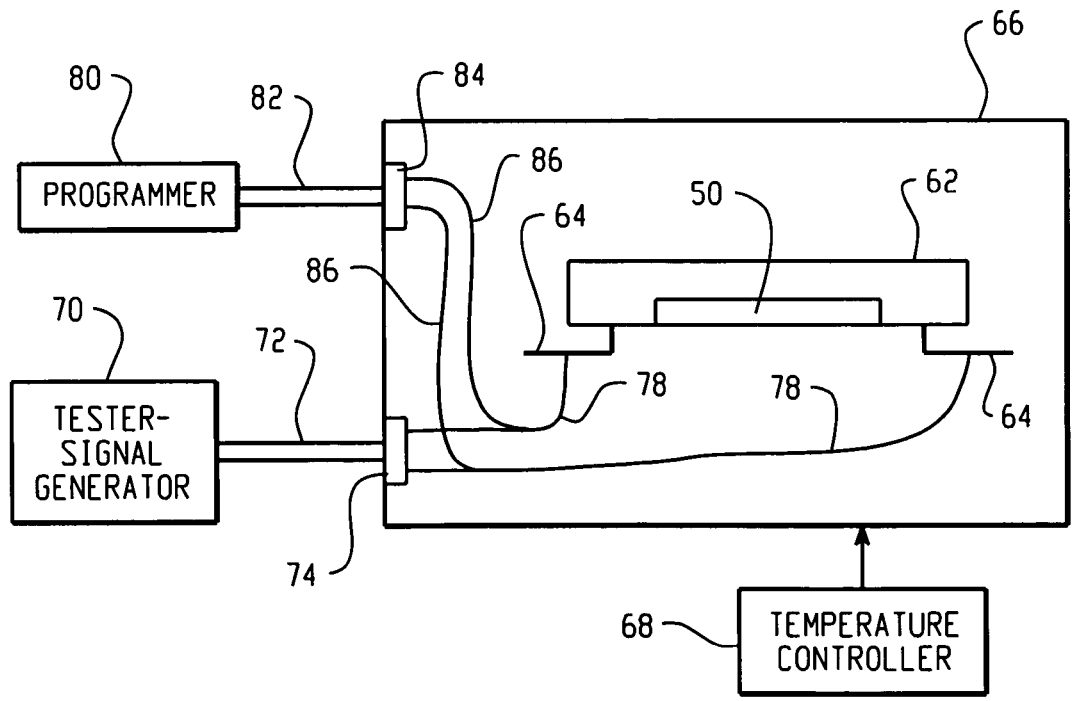

FIG. 4 is a flow chart of exemplary production steps suitable for embodying an aspect of the present invention. Block diagram schematics of FIGS. 5 and 6 exemplify production systems for use in conjunction with the flow chart steps of FIG. 4. In the embodiment of FIGS. 5-6, redundant RAM dies 50 with electrically programmable fuses for interconnecting the redundant rows and columns are fabricated on a silicon wafer 52. Since a row or a column may be redundant, rows and columns may be interchangeably referred to in the following text as redundant elements of the RAM. Referring to FIGS. 4-6, once the fabrication process is complete, the integrated circuit dies 50 of the wafer 52 may be coupled electrically to a tester unit 54 over test signal lines 56, for example. In step B1, each RAM of the dies 50 is tested at the wafer level by the tester unit 54. In step B2, if the tester unit 54 finds a failed row or column (element) in a RAM, it may command an electrical fuse programmer function 58 to program the RAM.

While the programmer block 58 is shown separate from the tester unit 54 in FIG. 5, it is understood that this depiction is merely illustrative of the separate functions performed thereby. The electrical fuse programmer function 58 may be integral to the tester unit 54. Thus, the tester unit 54 may be coupled directly to the dies 50 of the wafer 52 via the programmer function 58 over programming lines 60. Accordingly, unlike the laser programming embodiment, the tester unit 54 may program the RAM dies 50 without the use of a separate programmer. Techniques of blowing fuses electrically are known to those skilled in the pertinent art.

In the present embodiment, programming of the RAM redundant integrated circuit dies 50 may be accomplished at the wafer level in step B2 by running a vector on the die 50 in the tester unit 54 which may blow fuses thereof directly via programmer function 58 and programming lines 60. To connect a redundant element of a RAM die 50 to replace a failed element thereof, fuses are blown electrically by the tester unit 54 by increasing the voltage applied to the integrated circuit and passing a large current through a structure of the fuse. The large current changes the properties of the structure such that circuitry located on the integrated circuit can determine whether or not the fuse is blown.

Note that blowing fuses by laser programming as described herein above uses an additional step in the value chain as well as additional hardware while blowing fuses electrically may be accomplished using the same tester unit that was used to determine the element of the die to be replaced. Thus, blowing fuses electrically at the wafer level is generally considered more cost effective than blowing fuses by laser beam. In addition to the cost saving, electrically blown fuses tend to be more reliable than laser blown fuses.

In step B3, each programmed die 50 may be sectioned from the wafer 52 and disposed in an appropriate package 62. Input/output circuits of the die 50 are connected to corresponding pins 64 of the package 62 to form a RAM integrated circuit part. Each packaged part 62 undergoes a burn in period in step B4 to screen out parts that may fail early. A typical burn in process may include disposing the part in a high temperature oven 66, the temperature of which being controlled by a temperature controller 68. During the burn in operation, high voltage signals may be applied to the pins 64 of the RAM part 62 by a tester-signal generator 70 via signal lines 72, connector 74 and leads 78, for example. As noted supra, a typical burn in process may take approximately two hours, for example. Note that during the burn in step B4, the redundant elements of the RAM are burned in as well which may be accomplished by providing a vector during burn in which selects the redundant elements such that they may be test written as well. In the alternative, the RAM may be constructed so that the redundant elements are test written at the same time as the main array.

After burn in, the packaged parts 62 are retested by the tester 70 in step B5. If the part 62 fails the test because of a failed row or column in the RAM as determined by step B5, the redundant RAM of packaged part 62 may be reprogrammed electrically in step B6. To accomplish reprogramming at the package level in step B6, an electrical fuse programmer function 80, which may be integral to the tester unit 70, for example, may be connected to the pins 64 of the packaged part 62 via signal lines 82, connector 84 and lead lines 86, for example. The tester 70 may run a vector on the packaged die and via programmer function 80 may blow fuses of the die 50 electrically using lines 82, connector 84 and lines 86 to replace a failed element of the RAM in the package 62 with a redundant element.

Once the packaged part 62 is reprogrammed, it may be re-tested in step B7 to ensure proper operation of the replacement row or column. Steps B6 and B7 may be iterated until the repaired RAM of the packaged part 62 passes the test or all of the redundant elements are used and the part continues to fail. In this manner, the packaged parts 62 may be repaired to the extent of their redundant elements. Hence, any yield loss caused by failures in the RAM during burn in can be recovered by re-programming at the package level. Thus, the present method may increase production yield.

While the present invention has been described above in connection with one or more embodiments, it is understood that such presentation was made solely by way of example. Thus, the present invention should not be limited in any way by the embodiment(s) described supra, but rather construed in breadth and broad scope in accordance with the recitation of the claims appended hereto.

What is claimed is:

1. Method of production testing a random access memory (RAM) redundant integrated circuit die fabricated on a wafer, said method comprising the steps of:
   at the wafer level,
   testing said RAM redundant integrated circuit die;
   identifying a failed element of the redundant RAM of said integrated circuit die; and
   replacing said failed element with a redundant element in the redundant RAM of said integrated circuit die;
   Thereafter, sectioning said tested die from the wafer;
   packaging said sectioned die in an integrated circuit package;
   at the package level,
   performing a test on said packaged integrated circuit die;
   identifying a failed element of the redundant RAM of said packaged integrated circuit die; and
   replacing said failed element with a redundant element in the redundant RAM of said packaged integrated circuit die; wherein this step comprises electrically blowing fuses in the redundant RAM of the packaged integrated circuit die to replace the failed element with a redundant element.

2. The method of claim 1 wherein the steps of performing, identifying and replacing at the package level are repeated.

3. The method of claim 1 including repeating the steps of performing, identifying and replacing at the package level as long as there is a failed element identified after test.

4. The method of claim 1 including repeating the steps of performing, identifying and replacing at the package level until there is no redundant element left in the redundant RAM to replace a failed element.

5. The method of claim 1 wherein the step of replacing at the wafer level comprises electrically blowing fuses in the redundant RAM of the integrated circuit die to replace the failed element with a redundant element.

6. The method of claim 1 wherein the step of replacing at the wafer level comprises replacing a failed row of storage cells with a redundant row of storage cells in the redundant RAM of the integrated circuit die.

7. The method of claim 1 wherein the step of replacing at the wafer level comprises replacing a failed column of storage cells with a redundant column of storage cells in the redundant RAM of the integrated circuit die.

8. The method of claim 1 wherein the step of replacing at the package level comprises replacing a failed row of storage cells with a redundant row of storage cells in the redundant RAM of the integrated circuit die.

9. The method of claim 1 wherein the step of replacing at the package level comprises replacing a failed column of storage cells with a redundant column of storage cells in the redundant RAM of the integrated circuit die.

10. Method of testing a packaged random access memory (RAM) redundant integrated circuit die comprising:
    identifying a failed element in the redundant RAM of said packaged integrated circuit die; and
    replacing said failed element with a redundant element in the redundant RAM of said packaged integrated circuit die; wherein this step comprises electrically blowing fuses in the redundant RAM of the packaged integrated circuit die to replace the failed element with a redundant element.

11. The method of claim 10 wherein the steps of identifying and replacing are repeated.

12. The method of claim 10 including repeating the steps of identifying and replacing as long as there is a failed element in the redundant RAM of said packaged integrated circuit die.

13. The method of claim 10 including repeating the steps of identifying and replacing until there is no redundant element left in the redundant RAM to replace a failed element.

14. The method of claim 10 wherein the step of replacing comprises replacing a failed row of storage cells with a redundant row of storage cells in the redundant RAM of the integrated circuit die.

15. The method of claim 10 wherein the step of replacing comprises replacing a failed column of storage cells with a redundant column of storage cells in the redundant RAM of the integrated circuit die.

16. System for testing a packaged random access memory (RAM) redundant integrated circuit die comprising:
  a tester unit coupled to said packaged integrated circuit die and operative to identify a failed element in the redundant RAM of said packaged integrated circuit die; and
  a programmer coupled to said tester unit and packaged integrated circuit die and operative to replacing said failed element with a redundant element in the redundant RAM of said packaged integrated circuit die; wherein the programmer is operative to electrically blow fuses in the redundant RAM of the packaged integrated circuit die to replace the failed element with a redundant element.

17. The system of claim 16 wherein the programmer is integral to the tester unit.

18. System for testing a packaged random access memory (RAM) redundant integrated circuit die comprising:
  means for identifying a failed element in the redundant RAM of said packaged integrated circuit die; and
  means for electrically blowing fuses in the redundant RAM of the packaged integrated circuit die to replace the failed element with a redundant element.

* * * * *

UNITED STATES PATENT AND TRADEMARK OFFICE
CERTIFICATE OF CORRECTION

| | |
|---|---|
| PATENT NO. | : 7,284,168 B2 |
| APPLICATION NO. | : 11/043377 |
| DATED | : October 16, 2007 |
| INVENTOR(S) | : J. Michael Hill et al. |

Page 1 of 1

It is certified that error appears in the above-identified patent and that said Letters Patent is hereby corrected as shown below:

In column 4, line 12, in Claim 1, delete "Thereafter" and insert -- thereafter --, therefor.

Signed and Sealed this

Twentieth Day of October, 2009

David J. Kappos
*Director of the United States Patent and Trademark Office*